United States Patent
Rolbiecki et al.

(10) Patent No.: US 8,053,749 B2
(45) Date of Patent: Nov. 8, 2011

(54) MIRRORED-GATE CELL FOR NON-VOLATILE MEMORY

(75) Inventors: Roger Glenn Rolbiecki, Shoreview, MN (US); Andrew Carter, Minneapolis, MN (US); Yong Lu, Rosemount, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 213 days.

(21) Appl. No.: 12/389,817

(22) Filed: Feb. 20, 2009

(65) Prior Publication Data

US 2010/0117121 A1 May 13, 2010

Related U.S. Application Data

(60) Provisional application No. 61/112,264, filed on Nov. 7, 2008.

(51) Int. Cl.
*H01L 47/00* (2006.01)

(52) U.S. Cl. ............... 257/2; 257/3; 257/4; 257/316

(58) Field of Classification Search .......... 257/2–4, 257/316
See application file for complete search history.

(56) References Cited

U.S. PATENT DOCUMENTS

2006/0091549 A1* 5/2006 Kojima .............. 257/758

* cited by examiner

*Primary Examiner* — Thien F Tran
(74) *Attorney, Agent, or Firm* — Campbell Nelson Whipps LLC

(57) ABSTRACT

A memory comprising at least one memory cell operationally connected to a bit line, a source line and a word line. The memory cell comprises a substrate having a first source contact, a second source contact, and a bit contact between the first source contact and the second source contact, a first transistor gate electrically connecting the first source contact and the bit contact and a second transistor gate electrically connecting the bit contact and the second source contact. The word line electrically connects the first transistor gate to the second transistor gate.

23 Claims, 3 Drawing Sheets

MIRRORED-GATE CELL FOR NON-VOLATILE MEMORY

RELATED APPLICATIONS

This application claims priority to U.S. provisional patent application No. 61/112,264, filed on Nov. 7, 2008 and titled "Mirrored-Gate Bit Cell for Magnetoresistive Memories". The entire disclosure of application No. 61/112,264 is incorporated herein by reference.

BACKGROUND

In general, semiconductor memory includes a transistor electrically connected to a source line and to a bit or drain line. A word line, often oriented perpendicular to the source line and bit or drain line, supplies current or voltage to the transistor. A typical semiconductor memory has hundreds to thousands of transistors.

Reducing the size of a semiconductor memory is a constant goal of memory designers. Size directly contributes to cost of the memory based on the area needed for the memory. Additionally, the size directly contributes to the power requirements of the memory. In general, smaller size memories cost less and require less power.

BRIEF SUMMARY

The present disclosure relates to bit-cell architecture for reducing the total area needed for a memory array. The two-transistor architecture includes multiple contacts on the transistor contacts, thus reducing the overall bit-cell area and increasing memory density.

The disclosure provides memory cells and memories incorporating those cells. A memory comprises at least one memory cell operationally connected to a bit line, a source line and a word line.

One particular embodiment of this disclosure is a memory cell comprising a substrate having a first source contact, a second source contact, and a bit contact between the first source contact and the second source contact, a first transistor gate spanning and electrically connecting the first source contact and the bit contact and a second transistor gate spanning and electrically connecting the bit contact and the second source contact. A word line electrically connects the first transistor gate to the second transistor gate.

Another particular embodiment of this disclosure is a memory comprising a first source contact, a second source contact, and a third source contact. The memory also includes first bit contact and a second bit contact, the first bit contact between the first source contact and the second source contact and the second bit contact between the second source contact and the third source contact. A first transistor gate spans and electrically connects the first bit contact and the first source contact, a second transistor gate spans and electrically connects the first bit contact and the second source contact, a third transistor gate spans and electrically connects the second bit contact and the second source contact, and a fourth transistor gate spans and electrically connects the second bit contact and the third source contact.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. Any definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to memory cell architecture that utilizes shared elements to reduce the area needed for the architecture and thus provide increased memory density. The memory cell architecture includes source contacts that are electrically connected to two transistor gates and bit contacts that are electrically connected to two transistor gates. The memory cell has "n" bit contacts and "n+1" source contacts. Additionally, multiple (e.g., two) transistor gates (e.g., polysilicon transistor gates) are electrically connected together. While the present disclosure is not so limited, an appreciation of various aspects of the disclosure will be gained through a discussion of the examples provided below.

Figure 1:
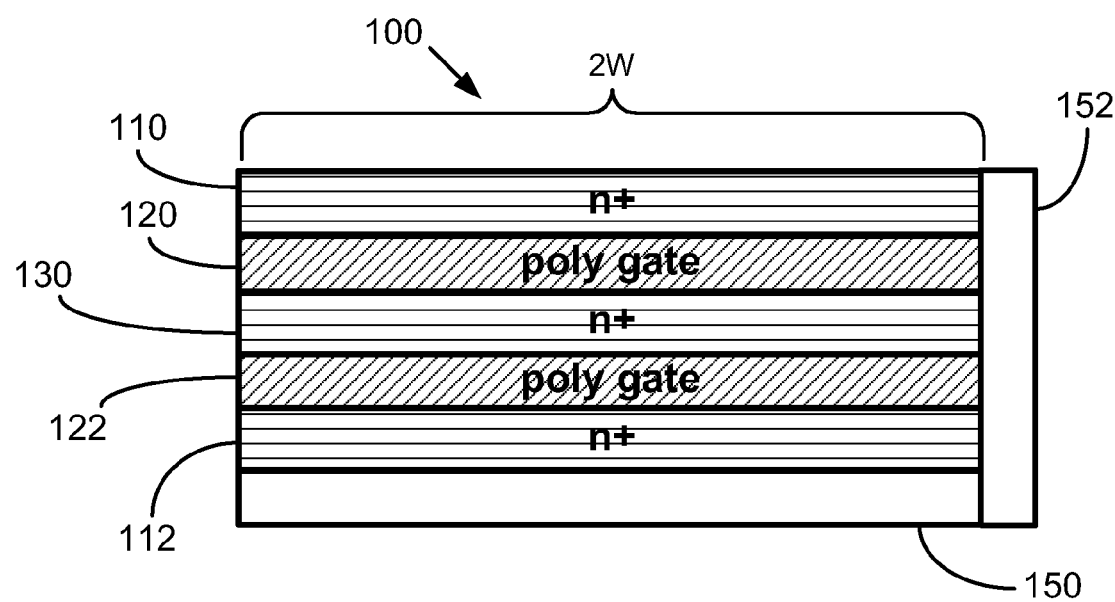
FIG. 1 is a schematic top view of a shared source two-bit memory cell.

FIG. 1 is a schematic rendering of a memory cell 100 that has two bit contacts and one source contact; memory cell 100 can be referred to as two bit memory or a two bit cell. Memory cell 100 has bit contacts 110, 112 and a source contact 130, which are electrically insulated from each other by transistor gates 120, 122 (e.g., polysilicon gates). Source contact 130 is electrically connected to each bit contact 110, 112 via gate 120, 122, respectively. Contacts 110, 112, 130 are regions of electrically conducting material, in most embodiments, of n-doped silicon. In some embodiments, contacts 110, 112, 130 may be regions of p-doped silicon. A field oxide insulator (FOX) 150 extends parallel to bit contact 112 and a second field oxide insulator (FOX) 152 extends transverse to each of bit contacts 110, 112 and source contact 130. In some embodiments, FOX 150, 152 may be replaced with shallow trench isolation (STI).

The various contacts 110, 112, 130 and gates 120, 122 have a width of 2W (indicated in FIG. 1). Assuming bit contacts 110, 112 have the same length "B", source contact 130 has a length "S", gates 120, 122 have the same length "L", and field oxide insulators 150, 152 have a length "F", the area occupied by memory cell 100 is (2B+S+2L+F)×(2W+F). As the length of field oxide insulators 150, 152 (i.e., "F") approaches zero, the area occupied by memory cell 100 is 4BW+2SW+4WL.

Memory cell 100 can be electrically connected to a bit line (or a drain line), to a source line, and to a word line to activate the bits of memory cell 100.

Figure 2:
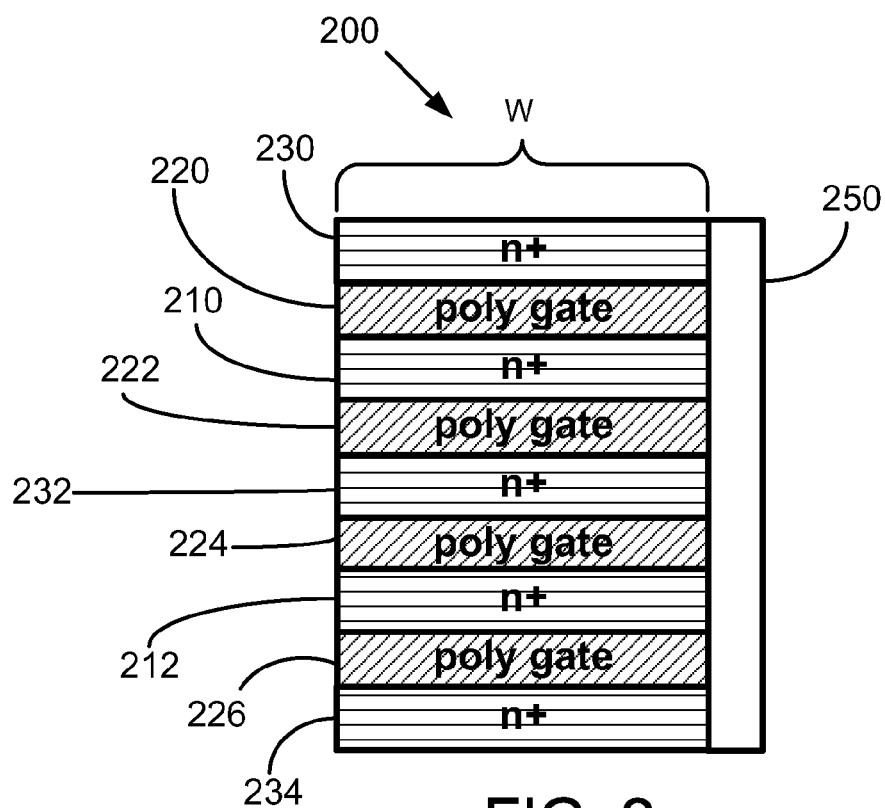
FIG. 2 is a schematic top view of a mirrored two-bit memory cell.

FIG. 2 is a schematic rendering of memory cell 200, which is a mirrored gate architecture, having a gate and a source contact mirrored on each side of a bit contact. Memory cell 200 is a four transistor (4T) cell with two memory bits; cell 200 has two bit contacts, three source contacts, and four gates. Memory cell 200 has "n" bit contacts and "n+1" source contacts. Memory cell 200 can be referred to as two bit memory or a two bit cell. Unless indicated otherwise, the various elements of memory cell 200 are the same as or similar to the elements of memory cell 100.

Memory cell 200 has bit contacts 210, 212 and source contacts 230, 232, 234, which are electrically insulated from each other by transistor gates 220, 222, 224 (e.g., polysilicon gates). Bit contact 210 is electrically connected to each source contact 230, 232 via gate 220, 222 respectively, and bit contact 212 is electrically connected to each source contact 232, 234 via gate 224, 226, respectively. An insulation element 250 extends transverse to each of bit contacts 210, 212 and source contacts 230, 232, 234. In some embodiments, insulation element 250 is a field oxide insulator (FOX) or shallow trench isolation (STI). Insulation element 250 physically spaces and electrically insulates memory cell 200 (particularly, contacts 210, 212, 230, 232, 234) from any adjacent memory cell column. Memory cell 200 is mirrored, because a gate is mirrored on each side of a bit contact (i.e., bit contact 210 is adjacent to and between gate 220 and gate 222, and bit contact 212 is adjacent to and between gate 222 and gate 224).

The various contacts 210, 212, 230, 232, 234 and gates 220, 222, 224, 226 have a width of W (indicated in FIG. 2). The width of memory cell 200 is half of the width of memory cell 100 of FIG. 1. As will be explained below in respect to FIG. 3, a memory cell having a word line connected to two transistor gates, as is memory cell 200, requires only half the physical width as one with a word line connected to one transistor gate, as is memory cell 100 of FIG. 1. Assuming bit contacts 210, 212 have the same length "B", source contacts 230, 232, 234 have a length "S", gates 220, 222, 224, 226 have the same length "L", and insulation element 250 has a length "F", the area occupied by memory cell 200 is (2B+3S+4L)×(W+F). As the length of field oxide insulator 250 (i.e., "F") approaches zero, the area occupied by memory cell 200 is 2BW+3SW+4WL, which is 2BW−SW less than the area of memory cell 100 of FIG. 1.

Memory cell 200 can be electrically connected to a bit line (or a drain line), to a source line, and to a word line to activate the various bits of memory cell 200 and provide a memory. This connection between the contacts of memory cell 200 and the bit or drain line or the source line may include a memory element that stores the data bit. This memory element may be a resistive element (e.g., a programmable metallization cell or a phase change metallization cell), a magnetic element, a spin torque element (e.g., magnetic tunnel junction (MTJ)), or other memory element to provide, respectively, resistive memory (RRAM), magnetic memory (MRAM), spin torque memory (ST RAM), or other suitable memory. The memory element is connected epitaxially to the bit contact. Memory cell 200 and other memory cells according to this disclosure are able to have a higher density because the bit contacts and the source contacts are shared by two gates. In some embodiments, every bit contact and source contact, other than the very first and last contact, are shared by two gates.

Figure 3:
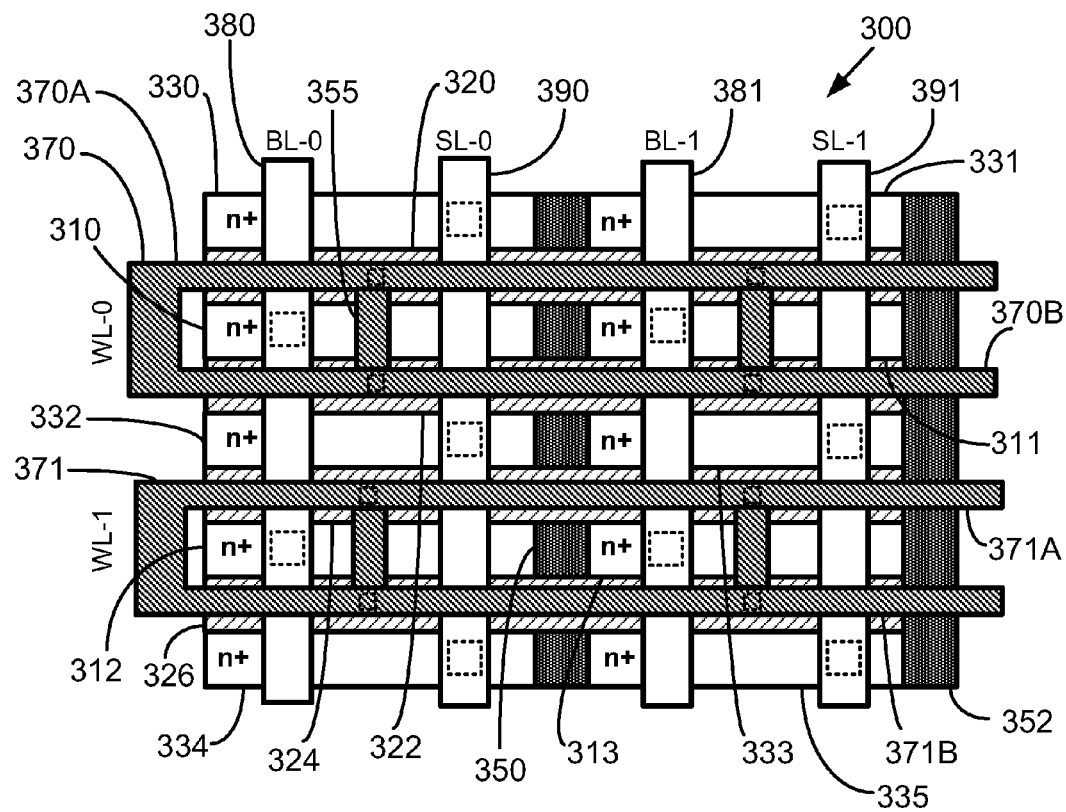
FIG. 3 is a schematic top view of a mirrored memory.

Memory 300, illustrated in FIG. 3, has four memory cells arranged in two columns and two rows. The memory cells of memory 300 are similar to memory cell 200 in that the memory cells of memory 300 have bit contacts and source contacts shared by two gates. Memory 300 is illustrated with various bit lines (or drain lines), source lines, and word lines connected to the memory cells. Between the memory cells and the bit or drain line or the source line is a memory element that stores the data bit. The memory element may be a resistive element, a magnetic element, a spin torque element, or other memory element.

Memory 300, in a first column, has bit contacts 310, 312 and source contacts 330, 332, 334 which are electrically insulated from each other by transistor gates 320, 322, 324, 326 (e.g., polysilicon gates). An insulation element 350 extends transverse to each of bit contacts 310, 312 and source contacts 330, 332, 334 and separates the first column from any second column. In some embodiments, insulation element 350 is a field oxide insulator (FOX) or shallow trench isolation (STI). This second column has bit contacts 311, 313 and source contacts 331, 333, 335 that are electrically insulated from each other by transistor gates 320, 322, 324, 326, which in this embodiment, are common and continuous through insulation element 350. An insulation element 352 (e.g., a field oxide insulator (FOX) or shallow trench isolation (STI)) defines the end of contacts 311, 313, 331, 333.

Interconnecting bit contacts 310, 312 of the first column is a bit line 380 (BL-0) and interconnecting source contacts 330, 332, 334 is a source line 390 (SL-0). Similarly, interconnecting bit contacts 311, 313 of the second column is a bit line 381 (BL-1) and interconnecting source contacts 331, 333, 335 is a source line 391 (SL-1). Memory 300, in this embodiment, has parallel bit lines 380, 381 and source lines 390, 391, however in other embodiments the bit lines may be orthogonal to the source lines.

Orthogonal to bit lines 380, 381 and source lines 390, 391 are word line 370 (WL-0) and word line 371 (WL-1). Each of word line 370, 371 electrically connects two transistor gates, specifically, gate 320 with gate 322 and gate 324 with gate 326. In the illustrated embodiment, each word line 370, 371 has two elongate arms 370A, 370B and 371A, 371B, respectively, extending parallel with gates 320, 322 and gates 324, 326, respectively. Respective arms 370A, 370B and 371A, 371B are connected at least once, and in the illustrated embodiment, at three locations along the length of arms 370A, 370B, 371A, 371B. In FIG. 3, jumper connection 355 is indicated connecting arm 370A and arm 370B (additional jumper connections are shown in FIG. 3, but not called out herein). By connecting (e.g., shorting) the two arms together, the same amplitude of signal (e.g., current) is achieved as through a single line of twice the width or length. For this reason, a memory cell having a word line connected to two transistor gates (e.g., memory cell 200 of FIG. 2 having a width W) requires only half the width as one with a word line connected to one transistor gate (e.g., memory cell 100 of FIG. 1 having a width 2W).

Figure 4:
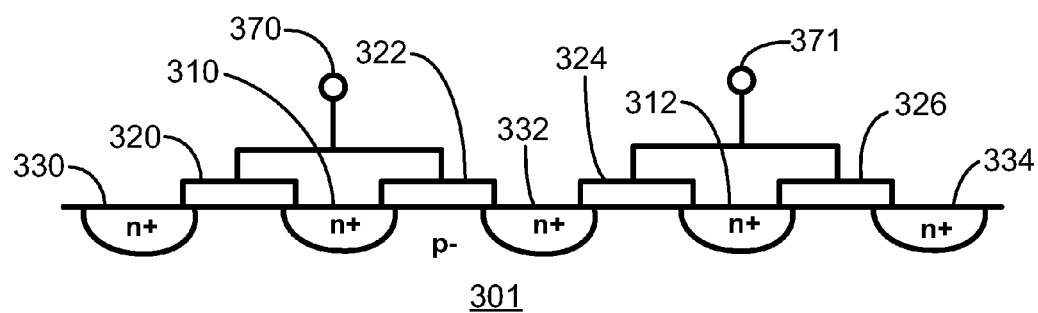
FIG. 4 is a schematic side view of a portion of the mirrored memory of FIG. 3.

FIG. 4 illustrates a portion of memory 300 of FIG. 3 from a side view, showing a substrate 301 (in some embodiments, p-doped silicon) having bit contacts 310, 312 and source contacts 330, 332, 334 (in some embodiments, n-doped silicon) therein. Transistor gate 320 spans bit contact 310 to source contact 330 and transistor gate 322 spans bit contact 310 to source contact 332. Gates 320, 322 are both connected to word line 370. Similarly, transistor gate 324 spans bit contact 312 to source contact 332 and transistor gate 326 spans bit contact 312 to source contact 334. Gates 324, 326 are both connected to word line 371.

Figure 5:
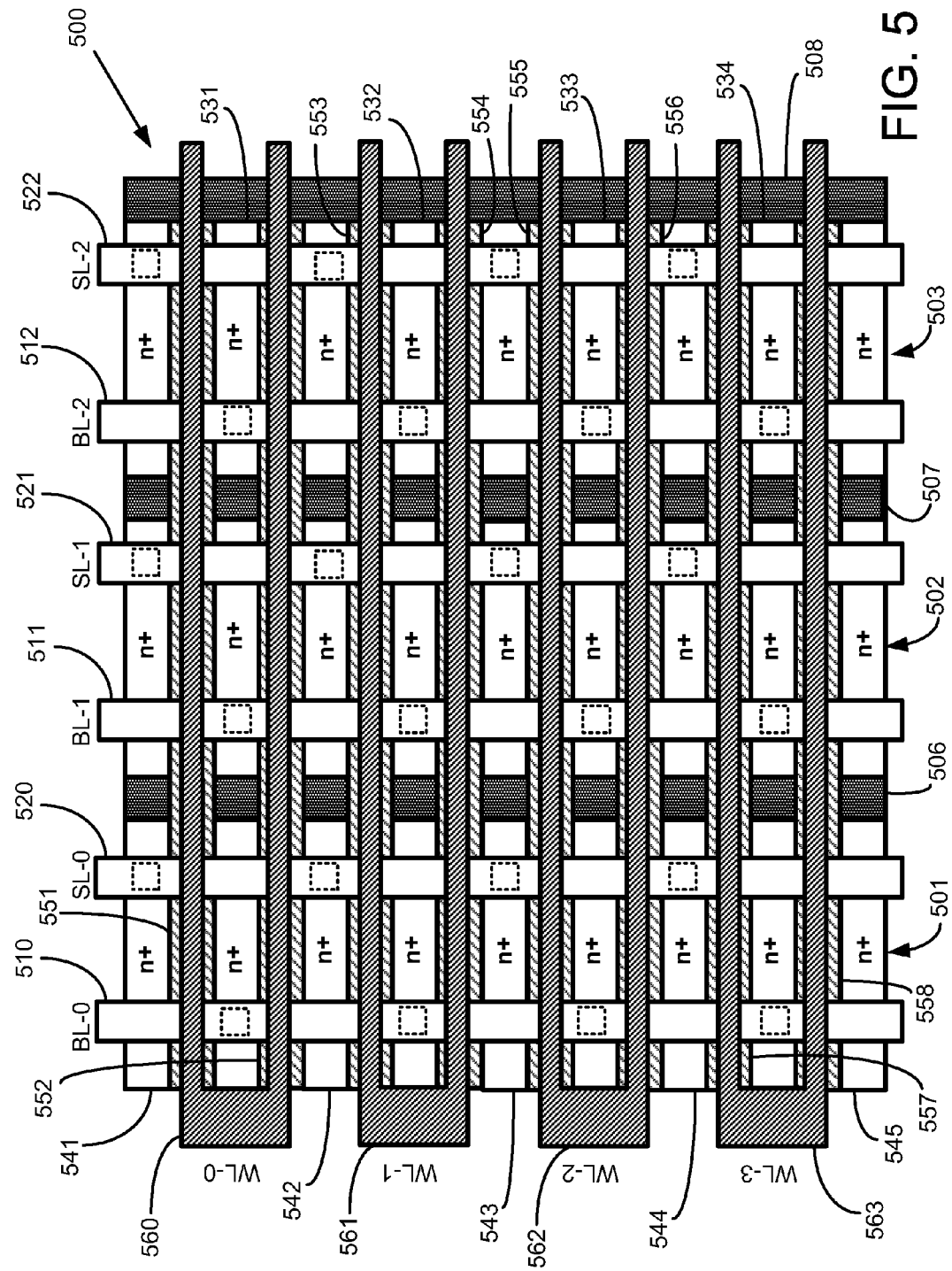
FIG. 5 is a schematic top view of another embodiment of a mirrored memory.

As indicated in FIG. 3, memory 300 has two columns with four transistors in each columns Memories and memory cells according to this disclosure, having bit contacts and source contacts shared by two gates and having two gates connected to a word line, may have any number of columns and rows. FIG. 5 illustrates a memory 500 having memory cells arranged in three columns, with eight transistors in each column, and with pairs of transistors connected by a word line. Various features and elements of memory 500 are the same or similar to those of memory cell 200 and/or memory 300, described above, unless indicated otherwise.

Illustrated memory 500 has twelve cells, arranged as three columns with eight rows. It is understood that memories could be made with any number of columns and rows of memory cells, the memory having hundreds or even thousands of memory cells. Each memory cell will have a bit contact between two source contacts, resulting in a memory that has "n" bit contacts and "n+1" source contacts.

Memory 500 has a first column 501, a second column 502, and a third column 503, separated by insulation element areas 506, 507. A third insulation element area 508 defines the end of third column 503. Each column 501, 502, 503 has a bit or drain line and a parallel source line extending along the length of the column. Specifically, first column 501 has bit line 510 (BL-0) and source line 520 (SL-0), second column 502 has bit line 511 (BL-1) and source line 521 (SL-1) and third column 503 has bit line 512 (BL-2) and source line 522 (SL-2). These lines extend the length of the column.

Each column 501, 502, 503 has four bit contacts 531, 532, 533, 534 and four source contacts 541, 542, 543, 544, 545 alternated with bit contacts 531, 532, 533, 534. A transistor gate spans across adjacent contacts; memory 500 has eight transistor gate arrays 551, 552, 553, 554, 555, 556, 557, 558, which span across the three columns 501, 502, 503, resulting in 24 total transistor gates. For example, gate 551 spans from source contact 541 to bit contact 531, gate 552 spans from bit contact 531 to source contact 542, etc. Connecting pairs of transistor gates are word lines, which extend orthogonal to the bit lines and source lines. Specifically, word line 560 (WL-0) connects gate 551 to gate 552, word line 561 (WL-1) connects gate 553 to gate 554, word line 562 (WL-2) connects gate 555 to gate 556 and word line 563 (WL-3) connects gate 557 to gate 558.

Various embodiments of memories and memory cells have been described above. The memories and memory cells of this disclosure have an architecture that includes source contacts that are electrically connected to two transistor gates and bit or drain contacts that are electrically connected to two transistor gates. Additionally, multiple (e.g., two) transistor gates are electrically connected together via a word line. In some embodiments, this architectural layout reduces the area needed for field oxide insulator areas. The memories and memory cells of this disclosure are mirrored, in that a gate is mirrored on each side of a bit contact. These various features provide a higher density and reduce the amount of area needed for the memory cell.

Thus, embodiments of the MIRRORED-GATE CELL FOR NON-VOLATILE MEMORY are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A memory cell comprising:
    a substrate having a first source contact, a second source contact, and a bit contact between the first source contact and the second source contact;
    a first transistor gate electrically connecting the first source contact and the bit contact;
    a second transistor gate electrically connecting the bit contact and the second source contact; and
    a word line electrically connecting the first transistor gate to the second transistor gate.

2. The memory cell of claim 1 wherein the substrate comprises p-doped silicon and the first source contact, second source contact, and bit contact comprise n-doped silicon.

3. The memory cell of claim 1 wherein the word line comprises a first arm connected to a second arm, the first arm electrically connected to the first transistor gate and the second arm electrically connected to the second transistor gate.

4. The memory cell of claim 1 further comprising an insulation element spanning at least the first source contact, the second source contact and the bit contact and separating them from an adjacent memory cell.

5. A memory comprising:
    a first source contact, a second source contact, and a third source contact;
    a first bit contact and a second bit contact, the first bit contact between the first source contact and the second source contact and the second bit contact between the second source contact and the third source contact;
    a first transistor gate spanning and electrically connecting the first bit contact and the first source contact;
    a second transistor gate spanning and electrically connecting the first bit contact and the second source contact;
    a third transistor gate spanning and electrically connecting the second bit contact and the second source contact;
    a fourth transistor gate spanning and electrically connecting the second bit contact and the third source contact;
    a first word line electrically connecting the first transistor gate to the second transistor gate; and
    a second word line electrically connecting the third transistor gate to the fourth transistor gate.

6. The memory of claim 5 wherein the first source contact, second source contact, third source contact, first bit contact and second bit contact each comprise n-doped silicon.

7. The memory of claim 5, wherein the memory has one more source contact than it has bit contacts.

8. The memory of claim 5 further comprising a field oxide insulator spanning at least the first source contact, second source contact, third source contact, first bit contact, and second bit contact; and separating them from an adjacent memory cell column.

9. A memory comprising:
    a first source contact, a second source contact, and a third source contact;
    a first bit contact and a second bit contact, the first bit contact between the first source contact and the second source contact and the second bit contact between the second source contact and the third source contact;
    a first transistor gate spanning and electrically connecting the first bit contact and the first source contact;

a second transistor gate spanning and electrically connecting the first bit contact and the second source contact;

a third transistor gate spanning and electrically connecting the second bit contact and the second source contact;

a fourth transistor gate spanning and electrically connecting the second bit contact and the third source contact; and a field oxide insulator spanning at least the first source contact, second source contact, third source contact, first bit contact and second bit contact and separating them from an adjacent memory cell column.

10. The memory of claim 9 wherein the first source contact, second source contact, third source contact, first bit contact and second bit contact each comprise n-doped silicon.

11. The memory of claim 9 further comprising a first word line electrically connecting the first transistor gate to the second transistor gate and a second word line electrically connecting the third transistor gate to the fourth transistor gate.

12. The memory of claim 9, wherein the memory has one more source contact than it has bit contacts.

13. A memory comprising:

at least one column having at least one memory cell;

at least one row having at least the one memory cell, the at least one memory cell comprising:

a first source contact, a second source contact, and a bit contact between the first source contact and the second source contact;

a first transistor gate spanning and electrically connecting the first source contact and the bit contact; and a second transistor gate spanning and electrically connecting the bit contact and the second source contact;

a source line electrically connected to the first source contact and the second source contact of the at least one memory cell;

a bit line electrically connected to the bit contact of the at least one memory cell; and a word line electrically connecting the first transistor gate and the second transistor gate.

14. The memory of claim 13 further comprising a second column and an insulation element between the first column and the second column, the second column having at least one memory cell.

15. The memory cell of claim 14 wherein the insulation element is a field oxide insulator.

16. The memory of claim 13 further comprising a memory element electrically connecting the bit contact and the bit line.

17. The memory of claim 16 wherein the memory is ST RAM and the memory element is a spin torque element.

18. The memory of claim 16 wherein the memory is RRAM and the memory element is a resistive element.

19. The memory of claim 13 wherein the word line comprises a first arm connected to a second arm, the first arm electrically connected to the first transistor gate and the second arm electrically connected to the second transistor gate.

20. The memory of claim 13, the at least one memory cell being a first memory cell, with the column further comprising a second memory cell adjacent the first memory cell, the second memory cell comprising:

the second source contact, a third source contact, and a second bit contact between the second source contact and the third source contact;

a third transistor gate spanning and electrically connecting the second bit contact and the second source contact; and a fourth transistor gate spanning and electrically connecting the second bit contact and the third source contact;

with a second word line electrically connecting the third transistor gate and the fourth transistor gate.

21. The memory of claim 20 wherein the word line comprises a first arm connected to a second arm, the first arm electrically connected to the first transistor gate and the second arm electrically connected to the second transistor gate, and wherein the second word line comprises a third arm connected to a fourth arm, the third arm electrically connected to the third transistor gate and the fourth arm electrically connected to the fourth transistor gate.

22. The memory of claim 20, the column further comprising a third memory cell adjacent the second memory cell and a fourth memory cell adjacent the third memory cell.

23. The memory of claim 20, wherein each memory cell has one more source contact than it has bit contacts.

* * * * *